United States Patent [19]

Okumura

[11] Patent Number: 5,408,102
[45] Date of Patent: Apr. 18, 1995

[54] PHOTO-COUPLER APPARATUS HAVING ADEQUATE PROTECTION AGAINST EXCESSIVE CURRENT AND HEAT RUNAWAY

[75] Inventor: Hisaya Okumura, Kawasaki, Japan

[73] Assignee: Kabushiki Kaisha Toshiba, Kanagawa, Japan

[21] Appl. No.: 181,225

[22] Filed: Jan. 13, 1994

[30] Foreign Application Priority Data

Jan. 14, 1993 [JP] Japan .................. 5-004837

[51] Int. Cl.6 .................. G02B 27/00; H03K 3/42
[52] U.S. Cl. .................. 250/551; 327/514
[58] Field of Search ............. 250/551, 214 R, 214 SN; 307/311

[56] References Cited

U.S. PATENT DOCUMENTS

| 4,777,387 | 10/1988 | Collins | 307/311 |
| 4,801,822 | 1/1989 | Idaka et al. | 307/311 |
| 4,931,656 | 6/1990 | Ehalt et al. | 250/551 |
| 5,057,694 | 10/1991 | Idaka et al. | 250/551 |
| 5,105,090 | 4/1992 | Miyajima et al. | 307/311 |
| 5,151,602 | 9/1992 | Idaka | 250/551 |

Primary Examiner—Stephone B. Allen
Attorney, Agent, or Firm—Finnegan, Henderson, Farabow, Garrett & Dunner

[57] ABSTRACT

A photo-coupler apparatus has a light emitting diode, a photo-diode array, an output MOSFET which is driven by the photoelectromotive force generated by said photo-diode array, and a circuit for limiting the gate voltage of said output MOSFET below a certain value. Said limiting circuit includes a first resistor for detecting output currents, an NPN transistor, a second resistor, and a PNP transistor. In this structure, the voltages developed across the first and second resistors are used to drive the NPN and PNP transistors respectively. In addition, the NPN transistor is connected to the gate of said MOSFET through said second resistor. According to this structure, the gate voltage of the output MOSFET is kept below a certain value by being controlled with the PNP transistor which is driven by the NPN transistor. Thus, stable protection against excessive current is achieved. In addition, a resistor having a small value can be used as the first resistor so as to reduce the heat loss of this apparatus.

9 Claims, 9 Drawing Sheets

PHOTO-COUPLER APPARATUS HAVING ADEQUATE PROTECTION AGAINST EXCESSIVE CURRENT AND HEAT RUNAWAY

BACKGROUND OF THE INVENTION

1. Field of the Invention

This invention generally relates to a photo-coupler apparatus used as a relay, and more particularly, to a photo-coupler apparatus which has an output MOSFET at the secondary side and is used under the condition in which the current flowing through the conducting electrode of this output MOSFET is limited below a certain value.

2. Description of the Prior Art

In FIG. 1, the circuit structure of a prior art photo-coupler apparatus is shown.

This photo-coupler apparatus is comprised of the following: a light emitting diode 1; a photo-diode array 2; a discharging circuit (a resistor) 3; an NPN transistor 4 utilized to limit the gate voltage of an output MOSFET mentioned later below a certain value; a resistor 5 for detecting an output current; and an output MOSFET 6.

Receiving light from light emitting diode 1, photo-diode array 2 generates a voltage which is used to turn on output MOSFET 6. Thus, by turning on or off of the current supplied to light emitting diode 1, MOSFET 6 turns on or off, permitting this apparatus to work as a relay.

In the apparatus shown in FIG. 1, resistor 5 converts the output current I1 into a voltage which is applied to the base-emitter of NPN transistor 4. Then, a collector current flows through transistor 4 as a function of this base-emitter voltage. As the output current increases, the collector current increases. Once the collector current has approached the photo-current value supplied by photo-diode array 2, the operational point of photo-diode array 2 varies. This results in the decrease of the gate voltage of output MOSFET 6. Due to this feedback effect, output current I1 does not exceed a certain value. The protection against excessive current is thus realized in this apparatus.

The output current limited as explained above is expressed by the following formula.

$$I1 = Vt/R1 \cdot ln(Isc/Is) \quad (1)$$

In this formula, I1 means the magnitude of the output current, Vt means the magnitude of thermal voltage, R1 means the resistance value of resistor 5, Isc means the magnitude of output current from photo-diode array 2, and Is means the saturation current of NPN transistor 4. Thermal voltage Vt is obtained by the following equation:

$$Vt = k \cdot T/q,$$

where k means the Boltzman constant, T means an absolute temperature, and q means the amount of electron charge.

There are three problems in the prior art photo-coupler apparatus described above.

First, the photo-coupler apparatus has a large heat loss. This is because resistor 5 is series-connected to the output line.

Base-emittor voltage Vbe of a conventional NPN transistor, which is used to limit the gate voltage of output MOSFET 6, is about 0.6 to 0.7 (V). Accordingly, a resistor having a value more than 4Ω is required, for example, in order to limit output current I1 below 150 mA (0.6 V /150 mA = 4Ω). The on-resistance of output MOSFET 6 is about several to tens Ω. The value 4Ω cannot therefore, be ignored as compared with the on-resistance of output MOSFET 6. As a result, the heat loss of the photo-coupler apparatus becomes significant.

Second, as is clearly understood from equation (1), the output current limited by NPN transistor 4 has light quantity dependence against light emitting diode 1. The reason of this is as follows. When the output current from photo-diode array 2 increases, a large collector current flows through NPN transistor 4. This results in the increase of base-emittor voltage Vbe as well as the output current.

Third, the protection against heat runaway is not enough.

Thermal voltage Vt and resistor 5, which is made from Si containing diffused impurities, have positive temperature dependence, while saturation current Is of NPN transistor 4 has negative temperature dependence. Since saturation current Is is dominant among those, output current I1 has negative temperature dependence. About −0.6 mA/°C. of temperature characteristic can be achieved by the prior art technique. This value is, however, not enough as compared with the value −1.5 mA/°C. of the derating curve of a conventional photo-coupler apparatus.

SUMMARY OF THE INVENTION

Accordingly, this invention has been made to overcome the above mentioned problems of the prior art photo-coupler apparatus.

The objective of the present invention is, therefore, to provide a photo-coupler apparatus which is designed to provide stable and adequate protection against excessive current and heat runaway.

In order to realize the above mentioned objective, the photo-coupler apparatus of this invention has the following as shown in FIG. 2: a light emitting diode 1; a photo-diode array 2; a discharging circuit (a resistor) 3; an NPN transistor 4 for limiting the output current obtained from this apparatus; a resistor 5 for detecting the output current; an output MOSFET 6 (N channel MOSFET, in this case); and a loading circuit 7. This loading circuit is to stabilize the operation of NPN transistor 4, and is comprised of a second resistor 71 and a PNP transistor 72 which may be replaced by two PNP transistors darlington-connected with each other.

According to the above mentioned structure, the voltage developed across output resistor 5 is applied to the base-emitter of NPN transistor 4 and the voltage developed across second resistor 71 is applied to the base-emittor of PNP transistor 72. When second resistor 71 has a great value, the collector current flowing through PNP transistor 72 is much greater than that flowing through NPN transistor 4. Accordingly, the gate voltage of output MOSFET 6 is mainly controlled by PNP transistor 72 which is driven by NPN transistor 4.

As mentioned above, NPN transistor 4 only controls a small current so as to drive PNP transistor 72. This results in the reduction of ohms of output resistor 5, and so, the reduction of heat loss of this apparatus. In addition, the light quantity dependence of the output current is greatly reduced. Still in addition, the temperature dependence of the output current approaches the derating curve of a conventional photo-coupler apparatus which is now in use as a relay. So, this invention can provide a photo-coupler apparatus having stable and adequate protection against excessive current and heat runaway.

In the photo-coupler apparatus shown in FIG. 2, an N channel MOSFET is used to be an output contact. In this invention, however, a P channel MOSFET can be used to be the output contact. In this case, a PNP transistor is used instead of NPN transistor 4 shown in FIG. 2, and NPN transistor is used instead of PNP transistor 72. Of course, the same advantages as those of the photo-coupler apparatus using an N channel MOSFET can be obtained in this apparatus.

These and other objectives, features, and advantages of the present invention will be more apparent from the following detailed description of preferred embodiments in conjunction with the accompanying drawings.

DETAILED DESCRIPTION OF PREFERRED EMBODIMENTS

Figure 1:
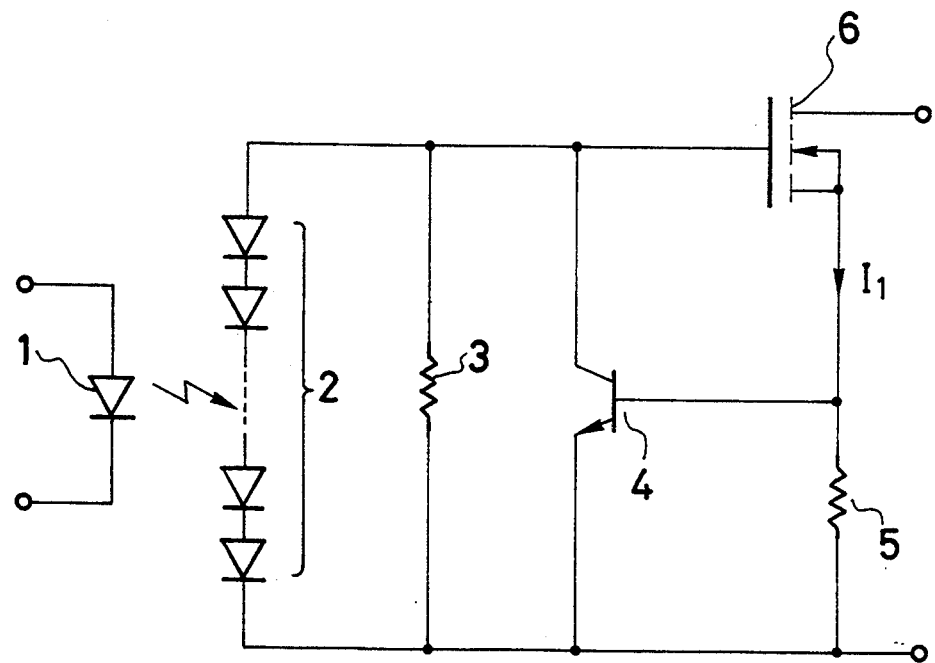
FIG. 1 is a circuit diagram showing the structure of a prior art photo-coupler apparatus.
Figure 2:
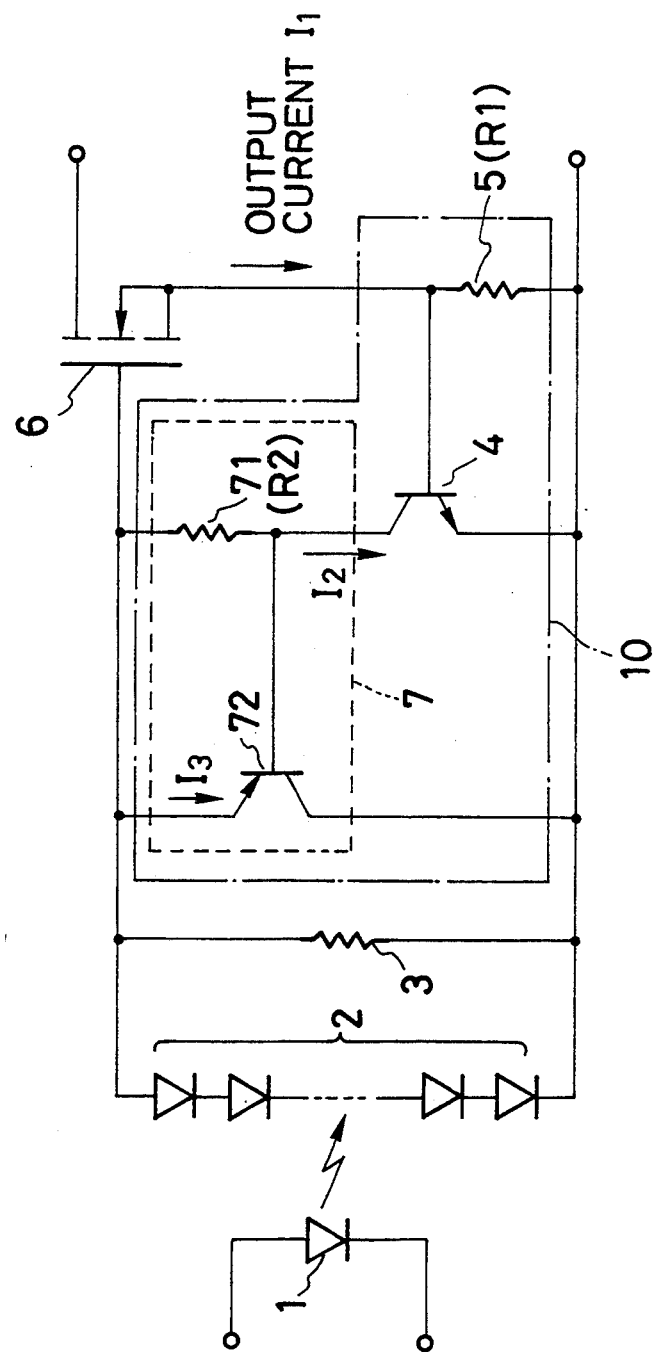
FIG. 2 is a circuit diagram showing the structure of a photo-coupler apparatus according to the first embodiment of this invention.

FIG. 2 is a circuit diagram showing the structure of the first embodiment of this invention. The photo-coupler apparatus shown in FIG. 2 is comprised of the following: a light emitting diode 1; a photo-diode array 2; an output MOSFET 6; a circuit 10 for limiting the gate voltage of output MOSFET 6; and a discharging resistor 3. Light emitting diode (LED) 1 emits light by activated with an input signal. Receiving the light from light emitting diode 1, photo-diode array 2 generates electromotive force which drives output MOSFET 6. Circuit 10 limits the gate voltage of output MOSFET 6 below a certain value.

Circuit 10 includes a first resistor 5 for the detection of an output current, an NPN transistor 4, and a loading circuit 7. In this circuit, the first end of resistor 5 is connected to the source of output MOSFET 6. Resistor 5 has a resistance R1. The collector of transistor 4 is connected to the gate of output MOSFET 6 through loading circuit 7, and its base is connected to the source of output MOSFET 6. In addition, its emitter is connected to the second end of first resistor 5.

Loading circuit 7 includes a second resistor 71 having a resistance R2 and a PNP transistor 72. The first end of resistor 71 is connected to the gate of output MOSFET 6 and its second end is connected to the collector of NPN transistor 4. And, the collector of PNP transistor 72 is connected to the second end of resistor 5, the base is connected to the second end of resistor 71, and the emitter is connected to the gate of output MOSFET 6.

The operation of the above mentioned photo-coupler apparatus will be described below.

When an input signal is applied to light emitting diode 1, it emits light. Receiving this light, photo-diode array 2 generates electromotive force which is then applied across the gate and source of output MOSFET 6. This makes output MOSFET 6 come into an on-state, and therefore, the drain-source resistance of MOSFET 6 becomes to a low resistance state (on-resistance state, R-on).

In this situation, by applying voltage VD across the drain-source of MOSFET 6, current I1 ($=$VD/R-on) flows as an output current through output resistor 5. As a result, a voltage I1×R1 arises across resistor 5. This voltage is used as the base-emitter voltage Vbe (Q1) of transistor 4.

When the base-emitter voltage Vbe (Q1) of transistor 4 becomes considerably high, a collector current I2 flows through this transistor. Current I2 induces a voltage I2×R2 across second resistor 71. This voltage becomes the base-emitter voltage Vbe (Q2) of PNP transistor 72.

When voltage Vbe (Q2) becomes considerably high, a collector current I3 flows through PNP transistor 72. In this case, as output current I1 increases, collector currents I2 and I3 increase. When value of I2+I3 approaches that of output current Isc of photo-diode array 2, its operational point changes so as to lower the gate voltage of output MOSFET 6. Because of this feedback effect, output current I1 is limited below a certain value, thus providing adequate protection against excessive current.

In the circuit shown in FIG. 2, when a large value (for example, 1MΩ) is selected as that of resistance R2, I3 becomes much larger than I2. In this case, most of output current Isc from photo-diode array 2 flows through PNP transistor 72, but not through NPN transistor 4. The relation between the collector currents I2 and I3 of NPN and PNP transistors 4 and 72 are shown in FIG. 3.

Figure 3:
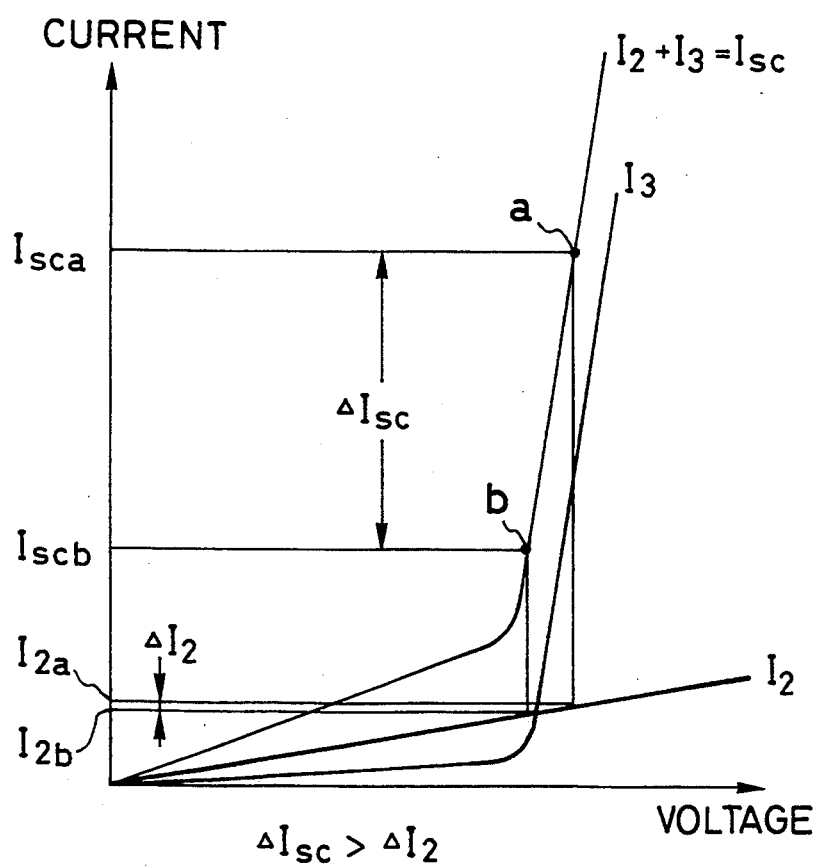
FIG. 3 is a graph showing the I-V characteristic of the collector current of the NPN transistor shown in FIG. 2.

As shown in FIG. 3, collector current I2 of NPN transistor 4 is very small as compared with output current Isc from photo-diode array 2. Accordingly, even if output current Isc of photo-diode array 2 changes according to the light quantity change of light emitting diode 1, current I2 does not change. This is because most of the variation in output current Isc from photo-diode array 2 is absorbed by the variation in collector current I3 of PNP transistor 72 ($\Delta$ Isc$\geq\Delta$ I2).

In other words, since NPN transistor 4 only controls small current I2, it is activated by base-emitter voltage Vbe (Q1) of a small value. As a result, first resistor 5 having a smaller value than that of the prior art can be used in this embodiment. In addition, as compared with the prior art, the light quantity dependence of output current I1 becomes very weak in this embodiment. This is because collector current I2 of NPN transistor 4 hardly changes according to the change of output current Isc from photo-diode array 2.

Next, the temperature dependence of this photo-coupler apparatus will be discussed below.

In general, base-emitter voltage Vbe of a transistor has negative temperature dependence, while a diffused resistor has positive one. Accordingly, output current I1 becomes small at a high temperature so as to maintain the same collector current I2 as that at room temperature. This fact means that NPN transistor 4 and resistor 5 works as if they have negative temperature dependence at a high temperature. In the similar manner, collector current I2 becomes small at a high temperature so as to maintain the same collector current I3 as that at room temperature. This fact also means that PNP transistor 72 and resistor 71 works as if they have negative temperature dependence at a high temperature. Because both NPN transistor 4 and PNP transistor 72 have negative temperature dependence as mentioned above, the circuit of this embodiment have negative temperature dependence stronger than that of the prior art. So, the protect ability against heat runaway is greatly improved in the photo-coupler apparatus of this embodiment.

Figure 4:
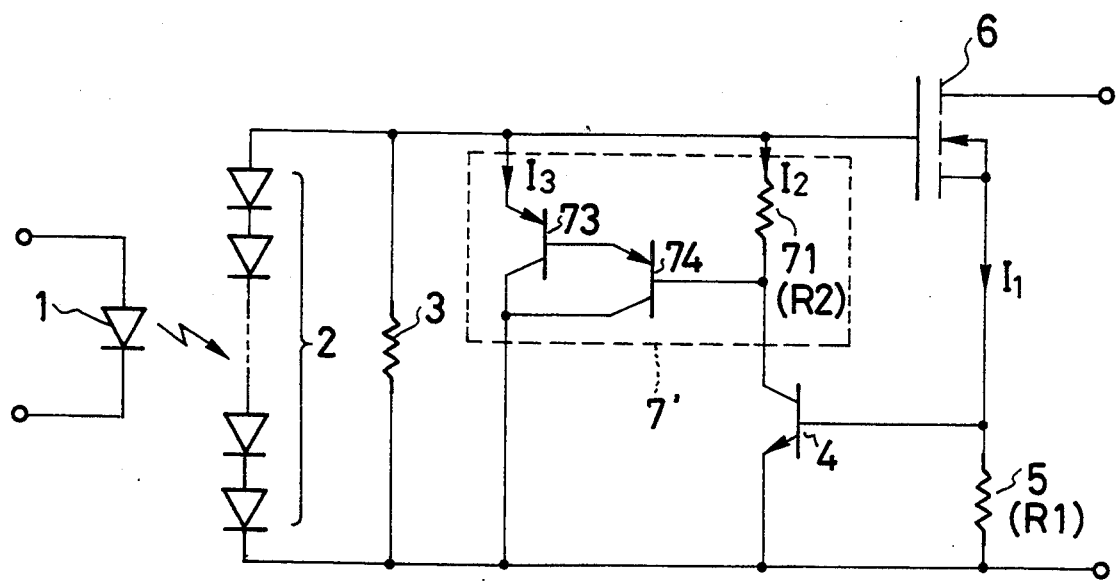
FIG. 4 is a circuit diagram showing the structure of a photo-coupler apparatus according to the second embodiment of this invention.

FIG. 4 is a circuit diagram showing the structure of a photo-coupler apparatus according to the second embodiment of this invention.

Loading circuit 7' of the photo-coupler apparatus shown in FIG. 4 has PNP transistors 73 and 74 instead of one PNP transistor 72 in the first embodiment. As shown, transistors 73 and 74 are connected with each other in a Darlington configuration. The operation of this photo-coupler apparatus is almost the same as that of the first embodiment, and therefore, this apparatus has the same advantages as those of the first embodiment.

In usual, the hFE (current amplification factor) of a PNP transistor, which is made together with an NPN transistor, is low, for example, 20 to 40. Therefore, in the circuit of the first embodiment, the base current of PNP transistor 72 flowing into NPN transistor 4 is relatively large and can't be ignored. Due to this current, the light quantity dependence of output current I1 is relatively strong. On the other hand, in the second embodiment, PNP transistor 72 of the first embodiment is replaced by PNP transistors 73 and 74 which are in a Darlington configuration. As a result, the said base current becomes smaller so as to weaken the light quantity dependence of output current I1.

In the photo-coupler apparatus shown in FIG. 4, output current I1 is obtained from the following formula.

$$I1 = Vt/R1 \cdot \ln(Vt/(Is1 \cdot R2) \cdot \ln(Isc2/(hFE2 \cdot Is2 \cdot Is3))) + Isc/(Is1 \cdot hFE2 \cdot hFE3)) \quad (2)$$

Where:
Is1 shows the saturation current of NPN transistor 4;
Is2 shows the saturation current of PNP transistor 73;
Is3 shows the saturation current of PNP transistor 74;
hFE2 shows the hFE of PNP transistor 73; and
hFE3 shows the hFE of PNP transistor 74.

Formula (2) gives an approximate value of output current I1 when output current Isc of photo-diode array 2 is relatively large.

Some characteristics of the photo-coupler apparatus shown in FIG. 4 will be compared with those of the prior art.

Figure 5:
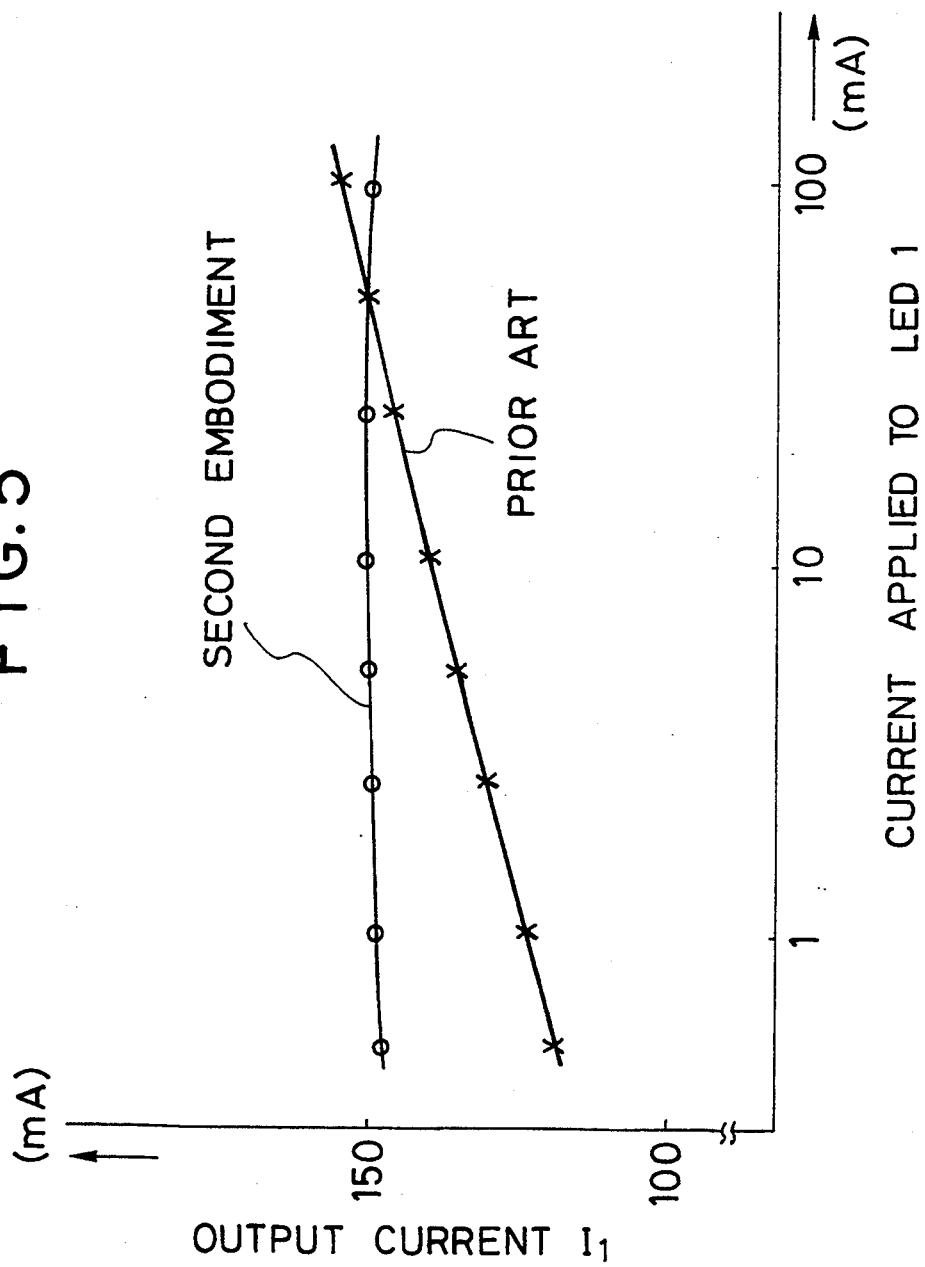
FIG. 5 is a graph showing the light quantity dependence of the prior art apparatus and of the apparatus according to the second embodiment.

In FIG. 5, the light quantity dependence of output current I1 is shown. In this figure, the light quantity emitted by light emitting diode 1 is shown as supplied current IF to light emitting diode 1. It is seen from FIG. 5 that, between the two cases where supplied currents IF to light emitting diode 1 are 1 mA and 50 mA, the changing rate of output current I1 is 102% in this embodiment while it is 122% in the prior art apparatus. As is clearly understood from this fact, the light quantity dependence of output current I1 can be neglected in this embodiment for practical use.

Figure 6:
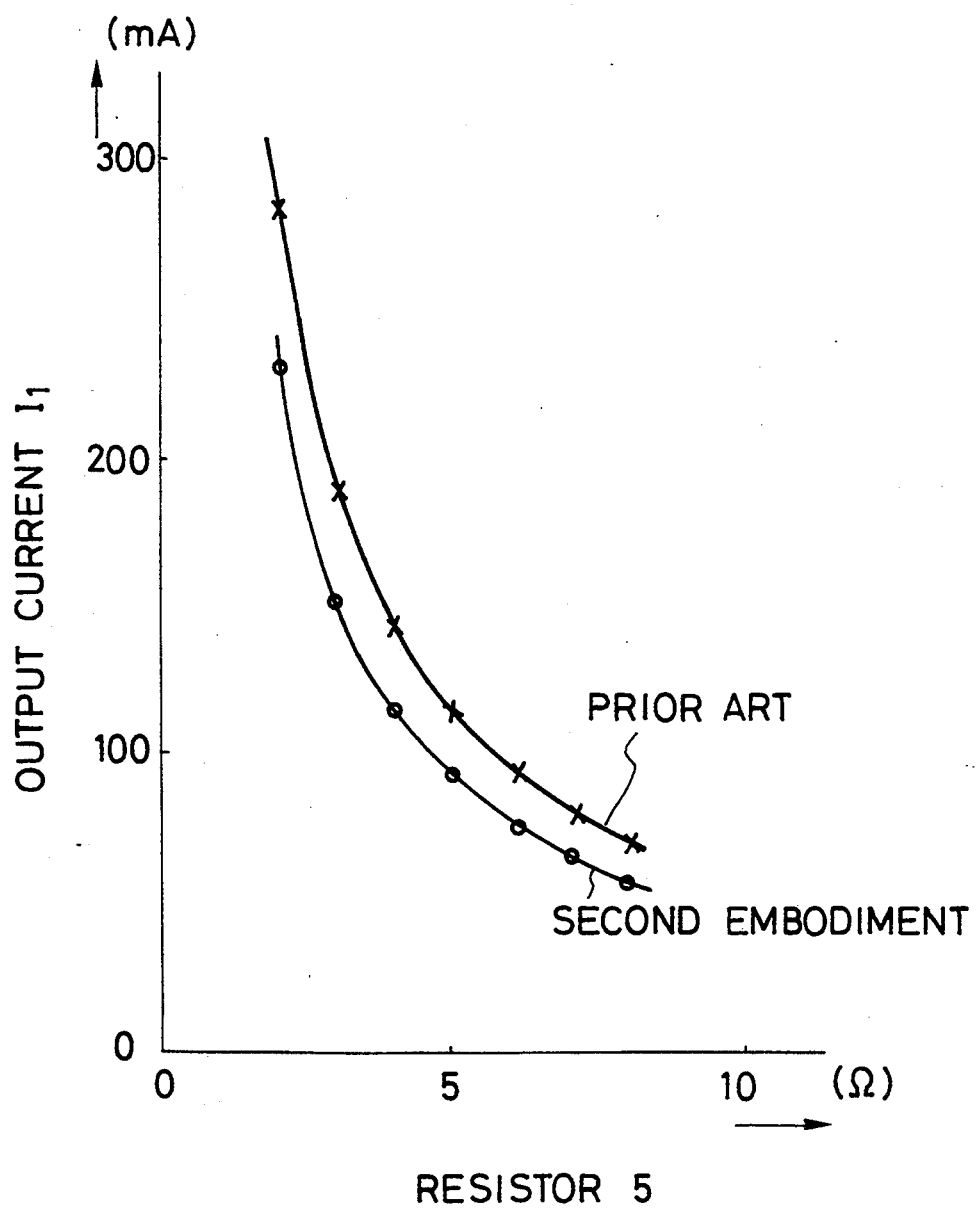
FIG. 6 is a graph showing the relations between ohms of the output resistor and the output current in the prior art apparatus and in the apparatus of the second embodiment.

In FIG. 6, the relation is shown between resistor 5 and output current I1. As shown in this figure, the apparatus of this embodiment requires a lower resistance value than that of the prior art apparatus. For example, in order to maintain output current I1 below 150 mA, 3.8Ω is required by the resistor of the prior art apparatus, while 3.0Ω is required by resistor 5 of this embodiment. Therefore, the magnitude of resistance is reduced in this embodiment more than 20%.

Figure 7:
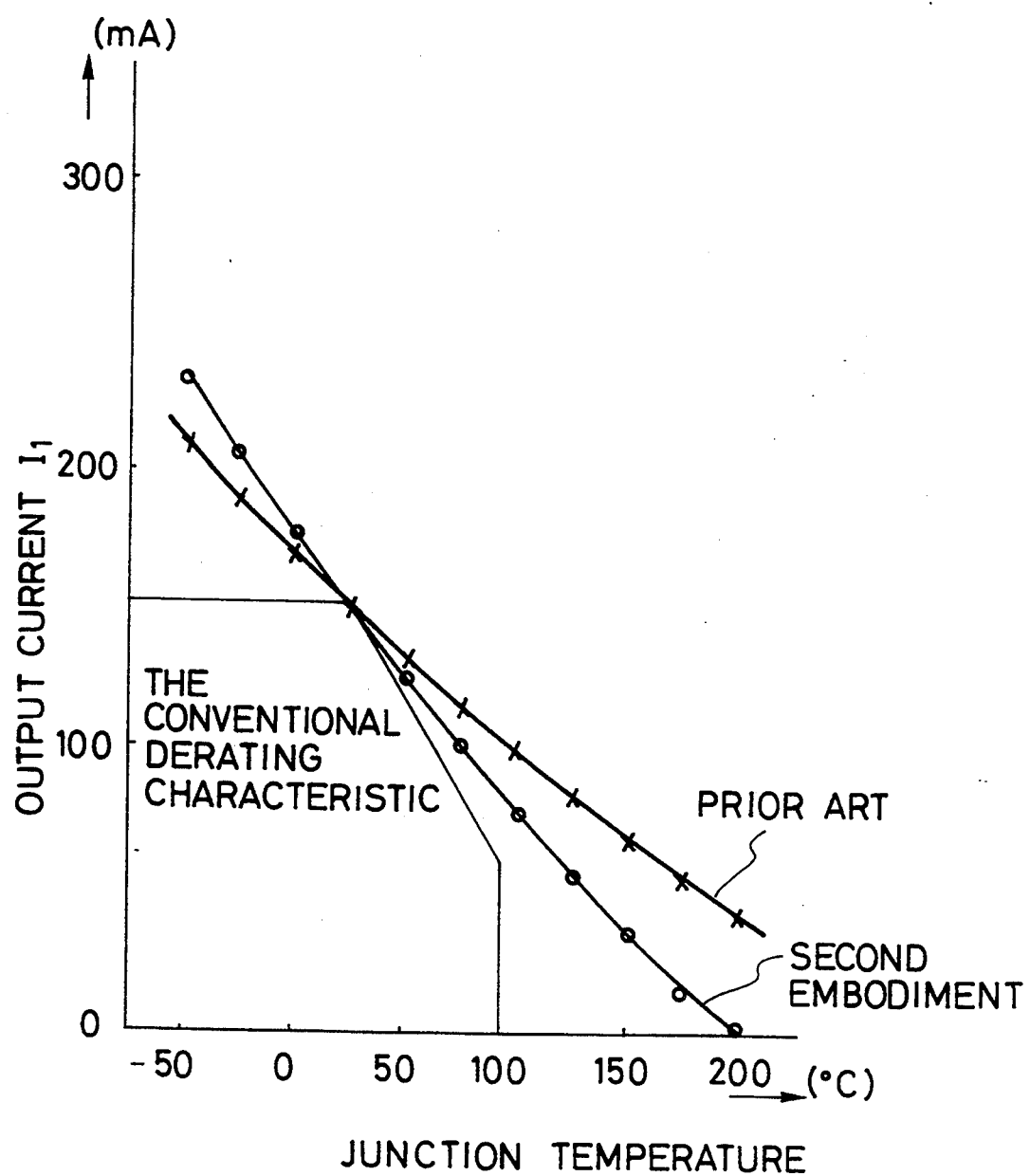
FIG. 7 is a graph for comparing the temperature characteristic of the prior art apparatus with that of the apparatus according to the second embodiment.

In FIG. 7, the temperature dependence of output current I1 is shown regarding the apparatus of this embodiment and the prior art apparatus. The dependence of the prior art apparatus is about −0.55 (mA/°C.) while it is about −0.95 (mA/°C.) in this embodiment. Thus, the temperature dependence is largely improved in this embodiment. The usual derating of output current I1 in a photo-coupler apparatus used in relay application is about −1.5 (mA/°C.). The photo-coupler apparatus of this embodiment can, therefore, achieve a derating value which is pretty close to said practical value. In addition, very little output current I1 is obtained above the junction temperature of 200 (°C.). This fact means that the apparatus of this embodiment has adequate protection against heat runaway.

Figure 8:
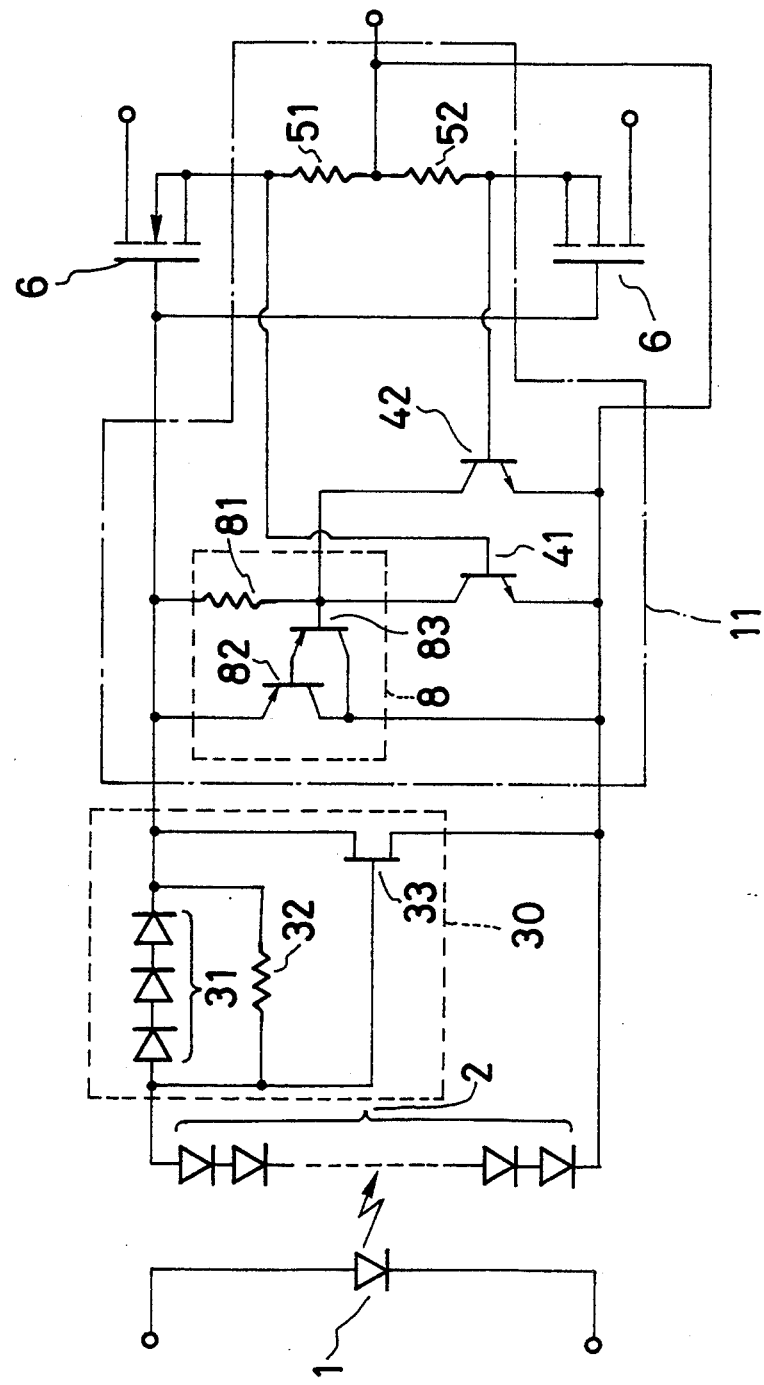
FIG. 8 is a circuit diagram showing the structure of a photo-coupler apparatus according to the third embodiment of this invention.

In FIG. 8, the structure of a photo-coupler apparatus is shown according to the third embodiment of this invention.

The photo-coupler apparatus of this embodiment is comprised of the following: light emitting diode 1; photo-diode array 2; first and second output MOSFETs 6 and 6'; a circuit 11 for limiting the gate voltage of output MOSFETs 6 and 6'; and a discharging circuit 30. First and second MOSFETs 6 and 6' are driven with electromotive force generated by photo-diode array 2, and are connected with each other so as to short the respective gates. Circuit 11 is to control the gate voltage of each MOSFET 6 or 6' below a certain value.

Circuit 11 includes a first and a second resistors 51 and 52, a first and a second NPN transistors 41 and 42, and a loading circuit 8. In resistors 51 and 52, each first end is connected with the respective source of output MOSFET 6 or 6', and the second ends are shorted to each other. The collector of first transistor 41 is connected to the gate of first MOSFET 6 through loading circuit 8. Also, the emitter of this transistor 41 is connected to the junction of first and second resistors 51 and 52. Further, the base of this transistor 41 is connected to the junction of first resistor 51 and the source of first MOSFET 6. On the other hand, the collector of second NPN transistor 42 is connected to the gate of first MOSFET 6 through loading circuit 8 and its emitter is connected to the junction of first and second resistors 51 and 52. Also, the base of second NPN transistor 42 is connected to the junction of the source of second MOSFET 6' and second resistor 52.

Loading circuit 8 is to stabilize the operation of first and second NPN transistors 41 and 42, and comprised of a resistor 81 and PNP transistors 82 and 83. As shown, the first end of resistor 81 is connected to the gate of first MOSFET 6 and its second end is connected to the collectors of first and second NPN transistors 41 and 42. The collector of first PNP transistor 82 is connected to the junction of first and second resistors 51 and 52. The base of first PNP transistor 82 is connected to the emitter of second PNP transistor 83, and its emitter is connected to the gate of first MOSFET 6. In this embodiment, second PNP transistor 83 is connected to first PNP transistor 82 so as to provide a Darlington configuration. However, second PNP transistor 83 is not always necessary in this apparatus due to the similar reason as that of the first embodiment.

In addition, discharging circuit 30 is comprised of a junction FET (JFET) 33 for use in discharge, a resistor 32, and a second photo-diode array 31 which generates photoelectromotive force to drive JFET 33 by receiving a light signal from light emitting diode 1.

The first and second embodiments shown in FIGS. 2 and 4 are structured so as to drive a load by a dc current. On the contrary, the third embodiment described above is structured so as to drive a load by an ac current. Except these points, the structure of the third embodiment is almost the same as those of the first and second embodiments, and so, they have the same advantages.

Figure 9:
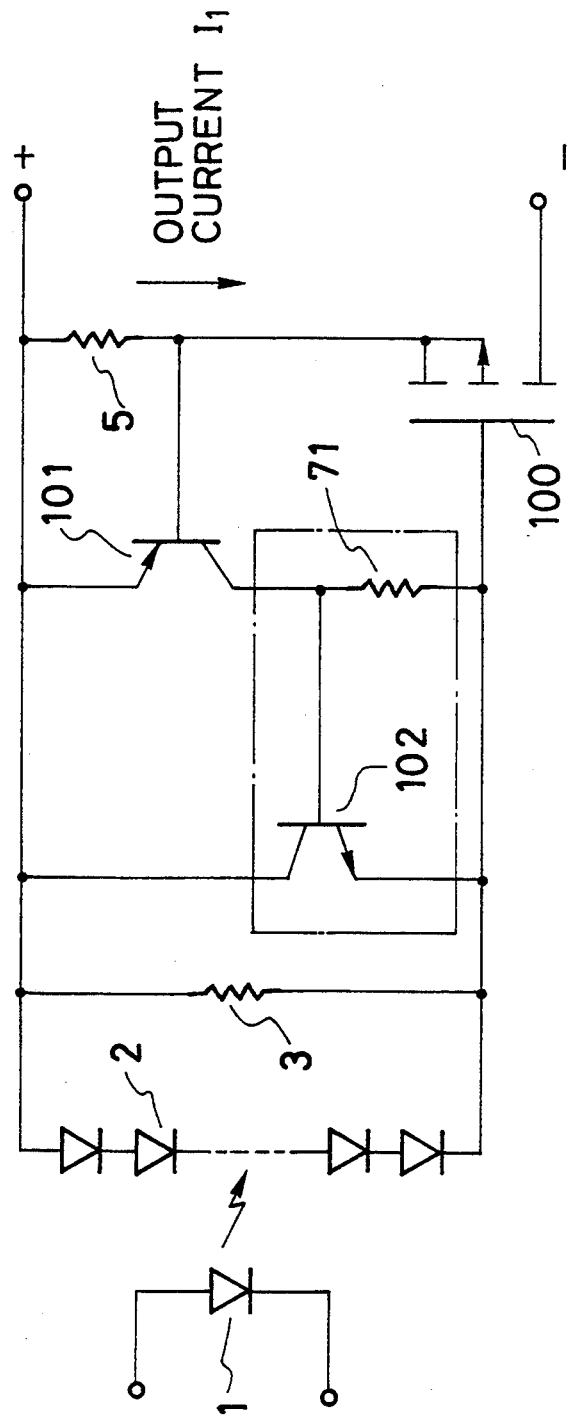
FIG. 9 is a circuit diagram showing the structure of a photo-coupler apparatus according to the fourth embodiment of this invention.

In said first, second, and third embodiments of this invention, N channel MOSFET 6 is used as an output contact. This invention can, however, use a P channel MOSFET as the output contact. FIG. 9 shows the circuit structure of the fourth embodiment of this invention, the embodiment in which a P channel MOSFET 100 is used instead of N channel MOSFET 6 shown in FIG. 2. As compared with the photo-coupler apparatus of the first embodiment shown in FIG. 2, the apparatus of the fourth embodiment has a PNP transistor 101 instead of NPN transistor 4 and NPN transistor 102 instead of PNP transistor 72. Besides these differences, there is no significant difference in the operation and the advantages between the fourth and the first embodiments.

As explained above using the first, second, third, and fourth embodiments, the circuit for limiting the gate voltage of an output MOSFET of this invention has a loading circuit in addition to an output resistor and an NPN transistor. The loading circuit is mainly comprised of a resistor and a PNP transistor so as to stabilize the operation of said NPN transistor. According to this structure, the gate voltage of the output MOSFET is mainly limited by the PNP transistor which is driven by an NPN transistor. Therefore, the output resistor for detecting an output current can be made to have a smaller resistance than that of the prior art. This fact lowers the heat loss of the photo-coupler apparatus of this invention. In addition, the light quantity dependence of the output current caused by the light emitting diode becomes very weak in this invention. Still in addition, the temperature dependence of the output current becomes very similar to the derating curve of a conventional photo-coupler apparatus. So, this invention can provide a photo-coupler apparatus, which is capable of limiting the gate voltage of the output MOSFET below a certain value and has adequate protection against excessive current and heat runaway.

If the PNP transistor in this invention is replaced by two PNP transistors in a Darlington configuration, the light quantity dependence of the output current due to the Light emitting diode can be further reduced.

This invention can also be applied to an ac driven load without loosing any advantages.

What is claimed is:

1. A photo-coupler apparatus, comprising:
   a light emitting element for emitting light when activated by an input signal;
   a photo-diode array for generating electromotive force by receiving an optical signal from said light emitting element;
   an output MOSFET driven by said electromotive force generated by said photo-diode array; and
   a circuit for limiting the gate voltage of said output MOSFET below a certain value;
   wherein said circuit includes;
      a first resistor for detecting output currents, the first end of said resistor being connected to the source of said output MOSFET;
      a transistor having a first conductivity type whose collector is connected to the gate of said output MOSFET, whose base is connected to the source of said output MOSFET, and whose emitter is connected to the second end of said resistor; and
      a loading circuit for stabilizing the operation of said transistor, said loading circuit being inserted between the gate of said output MOSFET and the collector of said transistor.

2. The photo-coupler apparatus as claimed in claim 1, wherein said loading circuit is comprised of a second resistor whose first end is connected to the gate of said output MOSFET and whose second end is connected to the collector of said transistor having the first conductivity type, and another transistor having a second conductivity type whose collector is connected to the second end of said resistor which is for detecting output currents, whose base is connected to said second end of said second resistor, and whose emitter is connected to the gate of said output MOSFET.

3. The photo-coupler apparatus as claimed in claim 1 or 2, wherein said output MOSFET is an N channel MOSFET, said transistor having the first conductivity type is an NPN transistor, and said transistor having the second conductivity type is a PNP transistor.

4. The photo-coupler apparatus as claimed in claim 1 or 2, wherein said output MOSFET is a P channel MOSFET, said transistor having the first conductivity type is a PNP transistor, and said transistor having the second conductivity type is an NPN transistor.

5. The photo-coupler apparatus as claimed in claim 1, wherein said loading circuit is comprised of:
   a second resistor whose first end is connected to the gate of said output MOSFET and whose second end is connected to the collector of said transistor; and
   a first and a second transistors having a second conductivity type, said transistors which are connected in a Darlington configuration with each other, the collector of said first transistor being connected to the second end of said resistor which is for detecting output currents, the base of said second transistor being connected to said second end of said second resistor, and the emittor of said first transistor being connected to the gate of said output MOSFET.

6. A photo-coupler apparatus, comprising:
a light emitting element for emitting light when activated by an input signal;
a photo-diode array for generating electromotive force by receiving an optical signal from said light emitting element;
a first and a second output MOSFETs driven by said electromotive force generated by said photo-diode array, both gates of said first and second output MOSFETs being shorted to each other; and
a circuit for limiting the gate voltage of said first and second output MOSFETs below a certain value;
wherein said circuit for limiting the gate voltage is comprised of:
a first and a second resistors for detecting output currents, the resistors in which the respective first ends are connected to the respective sources of said first and second output MOSFETs and the respective second ends are shorted to each other;
a first transistor having a first conductivity type whose collector is connected to the gate of said first output MOSFET through a loading circuit defined below, whose emittor is connected to the junction off said first and second resistors, and whose base is connected to the junction of the source of said first output MOSFET and said first resistor;
a second transistor having said first conductivity type whose collector is connected to the gate of said first output MOSFET through said loading circuit, whose emittor is connected to the junction of said first and second resistors, and whose base is connected to the junction of the source of said second output MOSFET and said second resistor; and
said loading circuit for stabilizing the operation of said first and second transistors.

7. The photo-coupler apparatus as claimed in claim 6, wherein said loading circuit includes:
a third resistor whose first end is connected to the gate of said first output MOSFET, and whose second end is connected to the collectors of said first and second transistors; and
a third transistor having a second conductivity type whose collector is connected to the junction of said first and second resistors, whose base is connected to the second end of said third resistor, and whose emittor is connected to the gate of said first output MOSFET.

8. The photo-coupler apparatus as claimed in claim 6, wherein said loading circuit includes:
a third resistor whose first end is connected to the gate of said first output MOSFET, and whose second end is connected to the collectors of said first and second transistors; and
a third and fourth transistors having a second conductivity type which are connected in a Darlington configuration with each other, the collector of said third transistor being connected to the junction of said first and second resistors, the base of said fourth transistor being connected to the second end of said third resistor, and the emittor of said third transistor being connected to the gate of said first output MOSFET.

9. The photo-coupler apparatus as claimed in claim 7 or 8, wherein said first and second MOSFETs are N channel MOSFETs, said first and second transistors having the first conductivity type are NPN transistors, and said third and fourth transistors having the second conductivity type are PNP transistors.

* * * * *